(12) United States Patent
Kurose

(10) Patent No.: US 12,040,310 B2
(45) Date of Patent: *Jul. 16, 2024

(54) METHODS OF FORMING SEMICONDUCTOR PACKAGES WITH BACK SIDE METAL

(71) Applicant: SEMICONDUCTOR COMPONENTS INDUSTRIES, LLC, Phoenix, AZ (US)

(72) Inventor: Eiji Kurose, Ojiya (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/069,257

(22) Filed: Dec. 21, 2022

(65) Prior Publication Data

US 2023/0118179 A1 Apr. 20, 2023

Related U.S. Application Data

(63) Continuation of application No. 17/163,674, filed on Feb. 1, 2021, now Pat. No. 11,562,981, which is a
(Continued)

(51) Int. Cl.
*H01L 21/78* (2006.01)
*H01L 21/285* (2006.01)
(Continued)

(52) U.S. Cl.
CPC .......... *H01L 24/94* (2013.01); *H01L 21/2855* (2013.01); *H01L 21/288* (2013.01);
(Continued)

(58) Field of Classification Search
CPC ................... H01L 24/94; H01L 21/565; H01L 2223/54453; H01L 2223/5446;
(Continued)

(56) References Cited

U.S. PATENT DOCUMENTS 10,943,886 B2 * 3/2021 Kurose ................... H01L 24/94
11,562,981 B2 * 1/2023 Kurose ................... H01L 24/11
(Continued)

*Primary Examiner* — Thanh Y. Tran

(74) *Attorney, Agent, or Firm* — Adam R. Stephenson, LTD.

(57) ABSTRACT

Implementations of a method of forming semiconductor packages may include: providing a wafer having a plurality of devices, etching one or more trenches on a first side of the wafer between each of the plurality of devices, applying a molding compound to the first side of the wafer to fill the one or more trenches; grinding a second side of the wafer to a desired thickness, and exposing the molding compound included in the one or more trenches. The method may include etching the second side of the wafer to expose a height of the molding compound forming one or more steps extending from the wafer, applying a back metallization to a second side of the wafer, and singulating the wafer at the one or more steps to form a plurality of semiconductor packages. The one or more steps may extend from a base of the back metallization.

20 Claims, 7 Drawing Sheets

Related U.S. Application Data continuation of application No. 15/965,081, filed on Apr. 27, 2018, now Pat. No. 10,943,886.

(51) Int. Cl.
| | | |
|---|---|---|
| *H01L 21/288* | (2006.01) |
| *H01L 21/304* | (2006.01) |
| *H01L 21/3065* | (2006.01) |
| *H01L 21/56* | (2006.01) |
| *H01L 23/00* | (2006.01) |

(52) U.S. Cl.
CPC ........ *H01L 21/304* (2013.01); *H01L 21/3065* (2013.01); *H01L 21/561* (2013.01); *H01L 21/565* (2013.01); *H01L 21/78* (2013.01)

(58) Field of Classification Search
CPC ... H01L 21/78; H01L 21/304; H01L 21/2855; H01L 21/3065; H01L 21/288; H01L 2924/18301; H01L 21/561; H01L 24/05; H01L 2223/54426; H01L 24/13; H01L 23/544; H01L 2224/1184; H01L 21/68; H01L 2924/10157

See application file for complete search history.

(56) References Cited

U.S. PATENT DOCUMENTS

| | | |
|---|---|---|
| 2008/0014677 A1 | 1/2008 | Xiaochun et al. |
| 2009/0215227 A1 | 8/2009 | Tan et al. |
| 2011/0147925 A1 | 6/2011 | Van Kempen et al. |
| 2013/0127044 A1 | 5/2013 | Poddar et al. |
| 2015/0340301 A1 | 11/2015 | Feng et al. |
| 2016/0225733 A1 | 8/2016 | Wilcoven |

\* cited by examiner

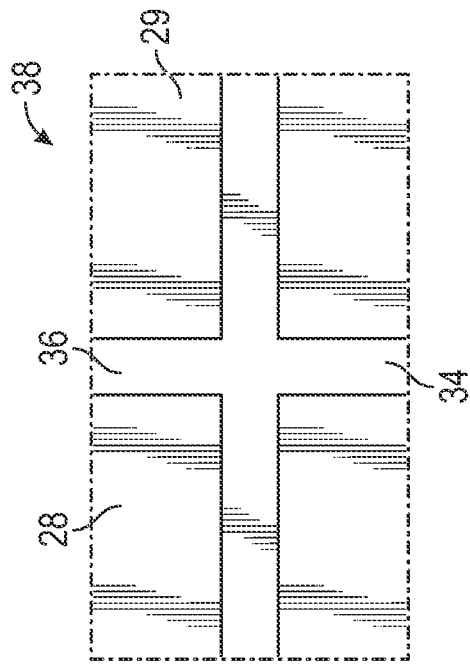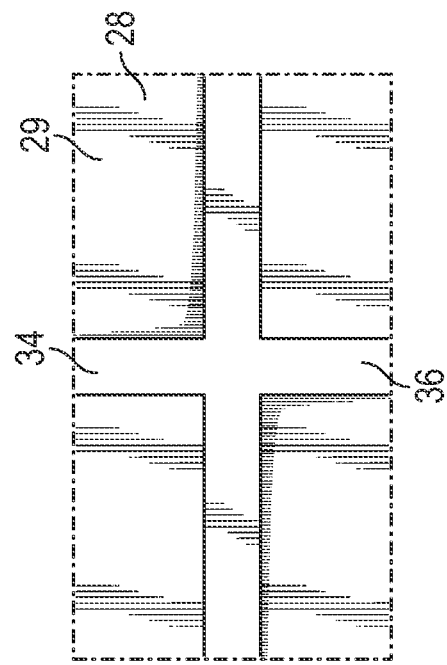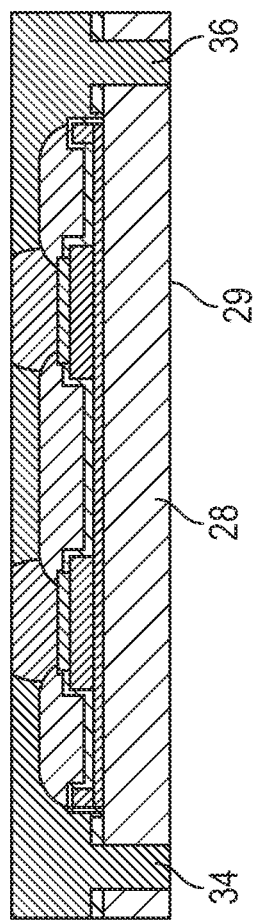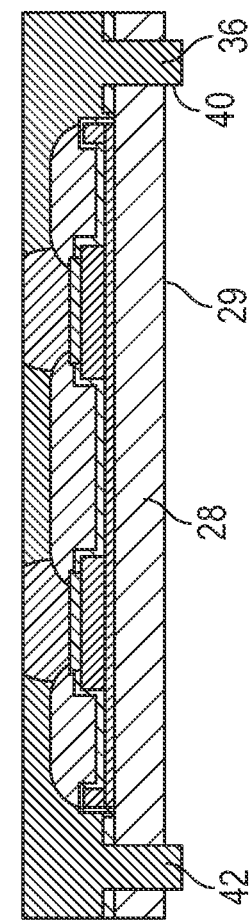
FIG. 3E
FIG. 3F

METHODS OF FORMING SEMICONDUCTOR PACKAGES WITH BACK SIDE METAL

CROSS REFERENCE TO RELATED APPLICATIONS

This application is a continuation application of the earlier U.S. Utility patent application to Kurose entitled "Methods of Forming Semiconductor Packages with Back Side Metal," application Ser. No. 17/163,674, filed Feb. 1, 2021, now pending, which application is a continuation application of the earlier U.S. Utility patent application to Kurose entitled "Methods of Forming Semiconductor Packages with Back Side Metal," application Ser. No. 15/965,081, issued Mar. 9, 2021 as U.S. Pat. No. 10,943,886, the disclosures of each of which are hereby incorporated entirely herein by reference.

BACKGROUND

1. Technical Field

Aspects of this document relate generally to semiconductor packages, such as flip chip or wafer level packages. More specific implementations involve chip scale packages having a chip with backside metal thereon.

2. Background

Backside metallization on a semiconductor package has been deposited across the entire surface of the wafer. To aid in manufacturing processes involving wafers, the backside of a wafer is typically ground and/or polished to a high degree of flatness and uniformity.

SUMMARY

Implementations of a method of forming semiconductor packages may include: providing a wafer having a plurality of devices and etching one or more trenches on a first side of the wafer between each of the plurality of devices. The method may further include applying a molding compound to the first side of the wafer wherein the molding compound fills the one or more trenches. The method may include grinding a second side of the wafer to a desired thickness and exposing the molding compound included in the one or more trenches. The method may include etching the second side of the wafer to expose a height of the molding compound wherein one or more steps are formed. The one or more steps may extend from the wafer. The method may also include applying a back metallization to a second side of the wafer. The one or more steps may extend from a base of the back metallization. The method may also include singulating the wafer at the one or more steps to form a plurality of semiconductor packages.

Implementations of a method of forming semiconductor packages may include one, all, or any of the following:

The method may further include using the one or more steps extending from the base of the back metallization to align the wafer during singulating the wafer.

The method may further include grinding the first side of the wafer to expose one or more bumps included in the plurality of devices.

Applying the molding compound may include compression molding.

Applying the molding compound may include printing.

Etching the second side of the wafer may include dry etching.

The plurality of steps may have a width of 50 to 100 microns.

The plurality of steps may have a height of 3 to 10 microns.

The back metallization may include titanium/copper sputtering.

The back metallization may include one of copper plating, nickel plating, gold plating, tin/silver plating, or any combination thereof.

Singulating the plurality of semiconductor packages may include sawing.

Implementations of a method of forming semiconductor packages may include: providing a silicon wafer including a plurality of devices and etching one or more trenches on a first side of the silicon wafer between each of the plurality of devices. The method may also include applying a molding compound to the first side of the silicon wafer. The molding compound may fill the one or more trenches. The method may also include grinding a second side of the silicon wafer to a desired thickness and exposing the molding compound included in the one or more trenches. The method may further include etching the second side of the silicon wafer to expose a height of the molding compound wherein one or more steps are formed extending from the silicon wafer. The method may also include applying a back metallization to a second side of the silicon wafer wherein the one or more steps extend from a base of the back metallization. The method may also include singulating the silicon wafer at the one or more steps to form a plurality of semiconductor packages.

Implementations of a method of forming semiconductor packages may include one, all, or any of the following:

The method may further include using the one or more steps extending from the base of the back metallization to align the wafer during singulating the wafer.

The method may further include grinding a first side of the wafer to expose one or more bumps included in the plurality of devices.

Applying the molding compound may include compression molding.

Applying the molding compound may include printing.

Etching the second side of the wafer may include dry etching.

The plurality of steps may have a width of 50 to 100 microns.

The plurality of steps may have a height of 3 to 10 microns.

The back metallization may include titanium/copper sputtering.

The back metallization may include one of copper plating, nickel plating, gold plating, tin/silver plating, and any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 3A-3H illustrate a semiconductor device at various points during an implementation of a method of singulating a semiconductor package.

DESCRIPTION

This disclosure, its aspects and implementations, are not limited to the specific components, assembly procedures or method elements disclosed herein. Many additional components, assembly procedures and/or method elements known in the art consistent with the intended method of forming semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such methods of forming semiconductor packages, and implementing components and methods, consistent with the intended operation and methods.

Figure 1:
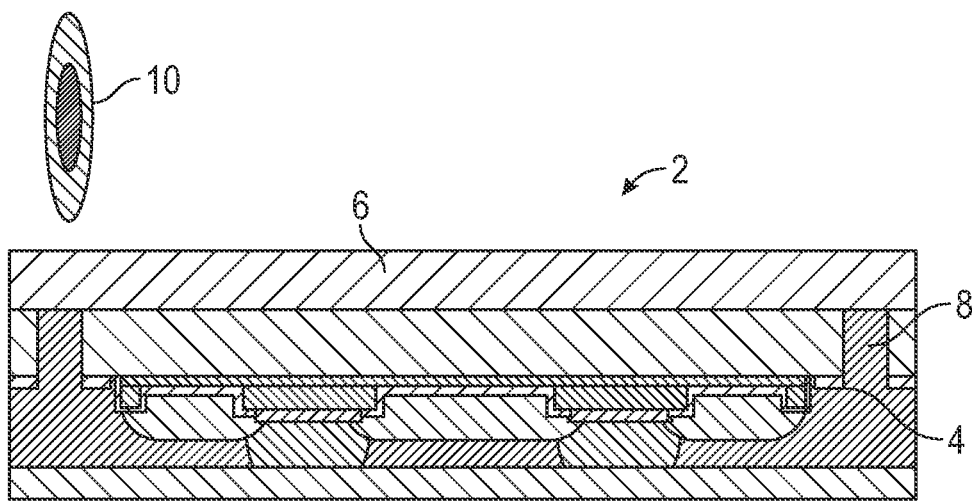
FIG. 1 is a cross sectional view of a semiconductor package having a metal backing.
Figure 2A:
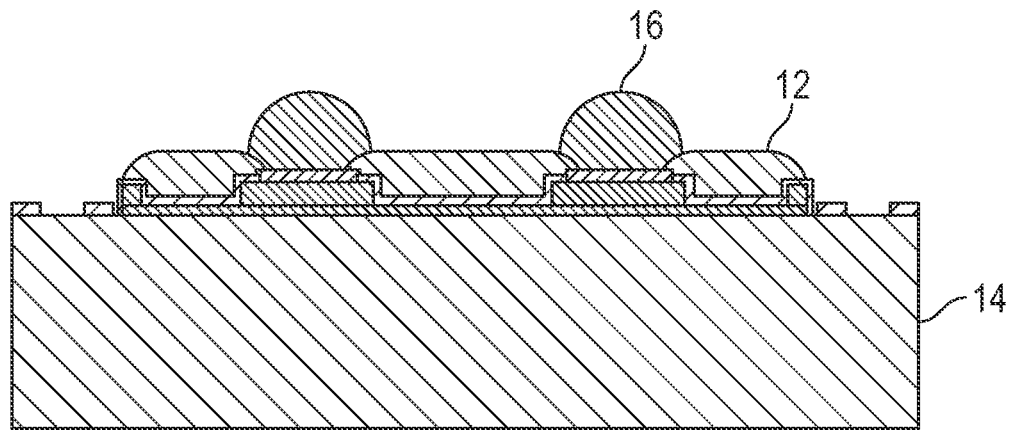
FIG. 2A-2G illustrate a semiconductor device at various points during a implementation of a method of singulating a semiconductor package.
Figure 2B:
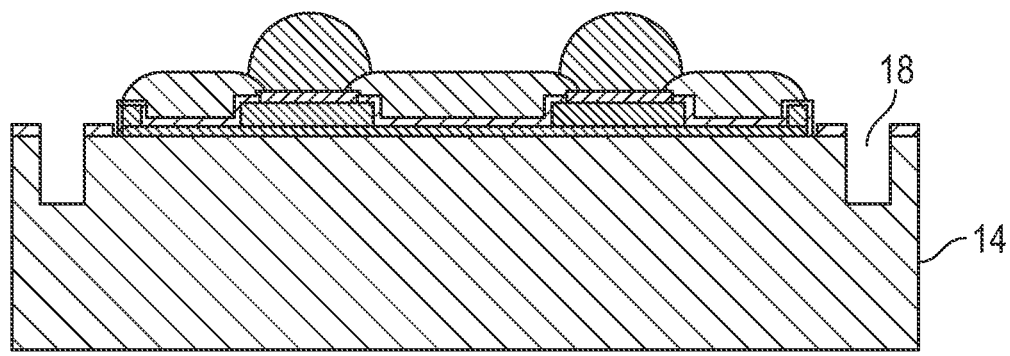
Figure 2C:
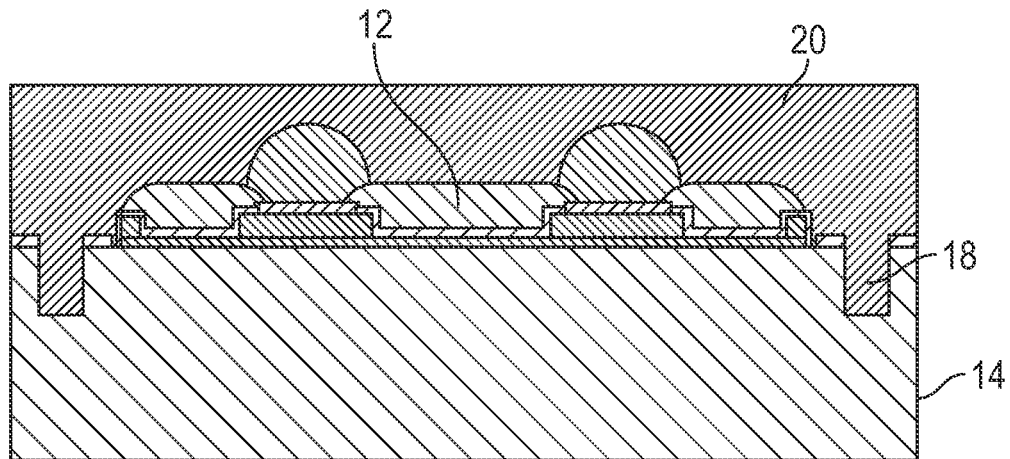

Referring to FIG. 1, a cross sectional view of a portion of a semiconductor wafer 2 having a plurality of semiconductor devices 4 is illustrated. The semiconductor wafer 2 includes a back metallization 6 across of the surface (back surface) of the semiconductor wafer 2. As illustrated, as the surface of the wafer has been polished to a high degree of flatness to aid in processing the wafer through the fabrication steps, there is no visible indication of the position of the scribe line 8 between the plurality of semiconductor packages 4 in the back side metallization 6. Because of this, there are no alignment features visible on the back surface of the wafer 2 for a saw 10 to employ when carrying out the singulation with the back metallization 6 facing the saw blade. Without these alignment features, the cuts may not be optimally aligned during cutting with the saw 10 resulting in yield loss and/or damage to the saw blade Referring to FIGS. 2A-2G, a semiconductor device at various points in an implementations of a method of forming a semiconductor package is illustrated. Referring to FIG. 2A, a semiconductor device 12 on a silicon wafer 14 is provided. While a single semiconductor device is illustrated in FIG. 2A and may be shown in the various figures in this application, since wafer scale packaging methods are disclosed herein, it is understood that the wafer 14 may include more than one semiconductor device. The semiconductor devices 12 on the semiconductor wafer 14 include bumps 16 having a height of about 30 μm to about 300 μm. Referring to FIG. 2B, trenches 18 are then etched into the silicon wafer 14. The trenches 18 may be etched through dry etching or half (partial) dicing using a saw blade. In various implementations, the trenches 18 may have a width between about 50 um to about 100 um and a depth between about 50 to about 200 um. Referring to FIG. 2C, the semiconductor device 12 is illustrated following application of a molding compound 20 to the silicon wafer 14 around the semiconductor device 12. The molding compound 20 may be applied through, by non-limiting example, compression molding, printing, spin coating, or any other method designed to fill the trenches 18 with mold compound and cover the surfaces of the bumps 16.

Figure 2D:
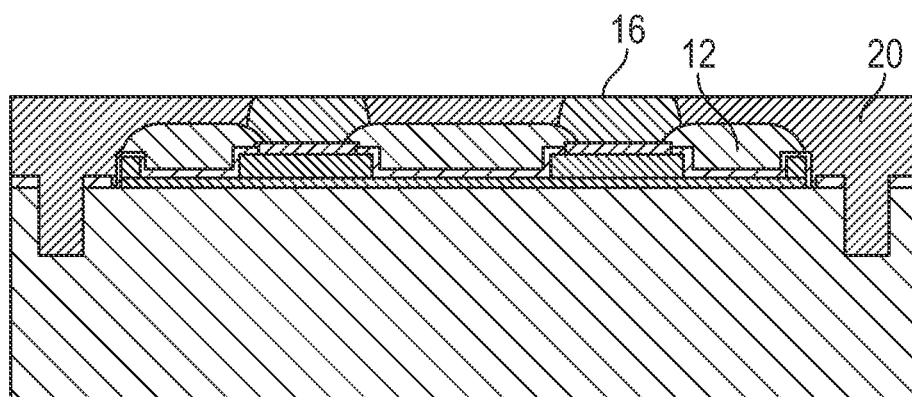
Figure 2E:
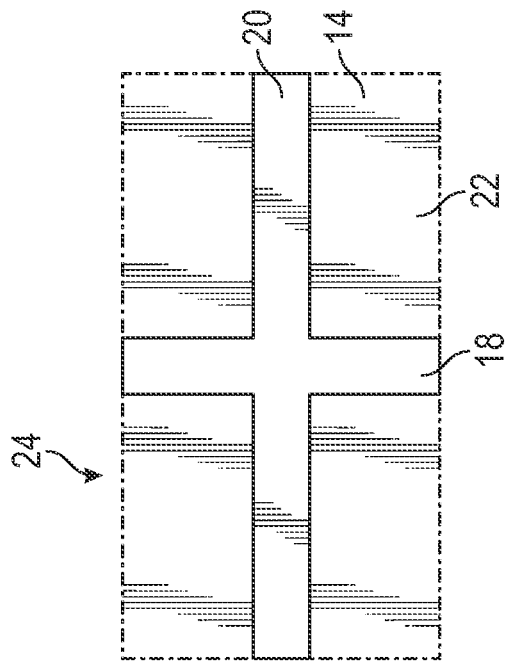
Figure 2E:
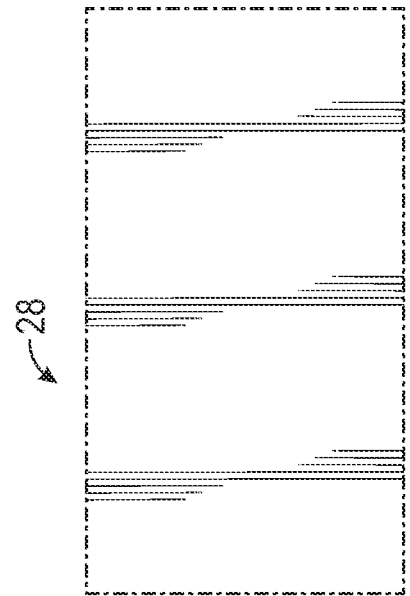
Figure 2E:
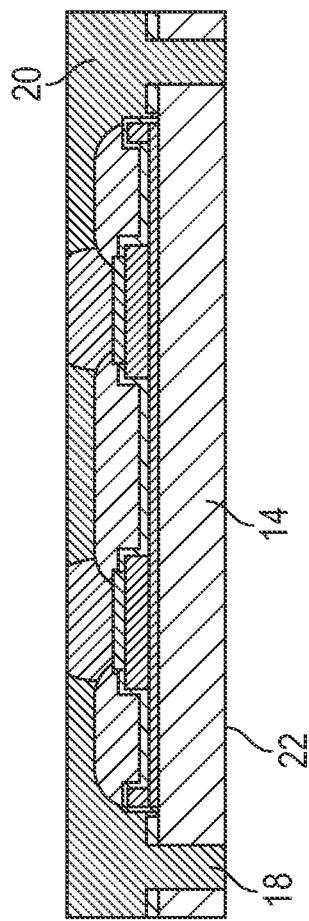
Figure 2F:
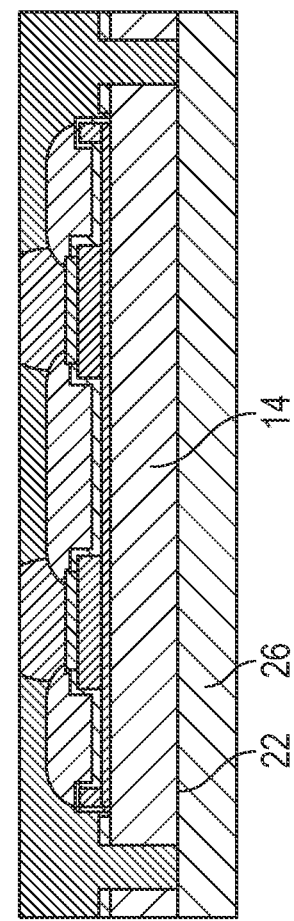
Figure 2G:
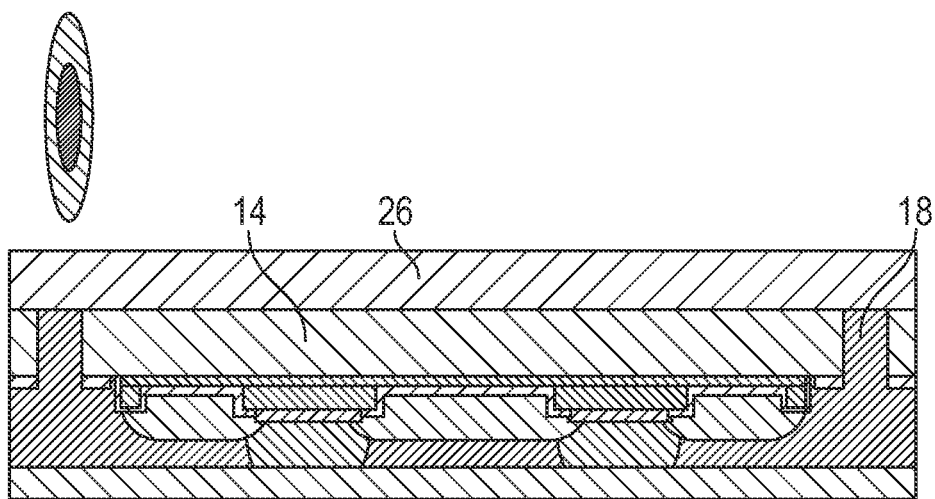

Referring to FIG. 2D, the method includes grinding the molding compound 20 down to expose a surface of the bumps 16 on the semiconductor device 12. As illustrated in FIG. 2D, in the process of grinding may grind away a portion of the material of the bump in the process in various implementations. However, in some implementations, particularly where the bumps are stud bumps with substantially flat upper surfaces, little to no material of the bump may be ground away during this portion of the process. Referring to FIG. 2E, the method includes grinding the back side 22 of the semiconductor wafer 14 to a thickness of about 20 um to about 200 um, depending on the depth of the trenches 18 previously formed into the material of the wafer. In this way, the actual semiconductor devices are singulated, being held together through the mold compound, and not through the underlying wafer material. Grinding the back side 22 continues until the molding compound 20 is exposed in the trenches 18. Referring to the figure on the right of FIG. 2E, a backside view 24 of the semiconductor wafer 14 illustrates the intersection of several trenches 18 etched into the semiconductor wafer 14 but which are now occupied only by the mold compound material. Referring to FIG. 2F, the semiconductor device is illustrated following application of back metallization 26 to the back surface 22 of the semiconductor wafer 14. As shown in the bottom view 28 of the metallization 26, and FIG. 2G, the trenches are no longer visible on the second side of the semiconductor wafer 14, as the material of the back metallization has covered up both the semiconductor die surfaces and the surface of the mold compound in the streets, leaving them substantially flat.

Figure 3A:
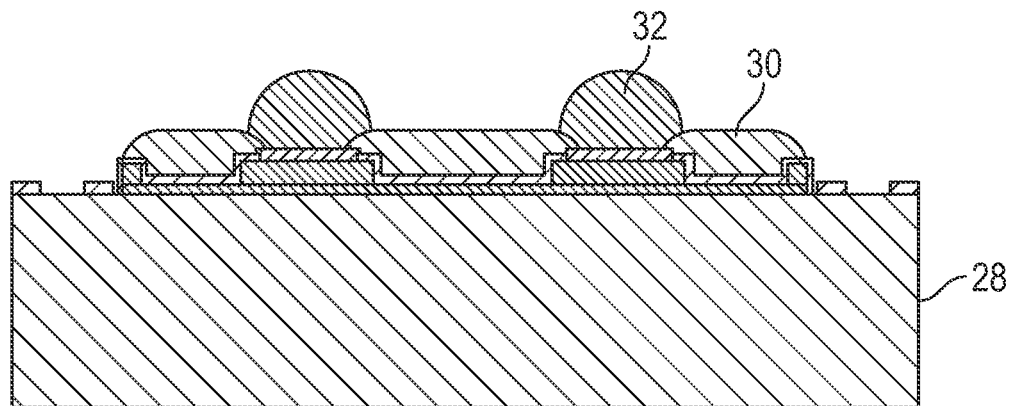
Figure 3B:
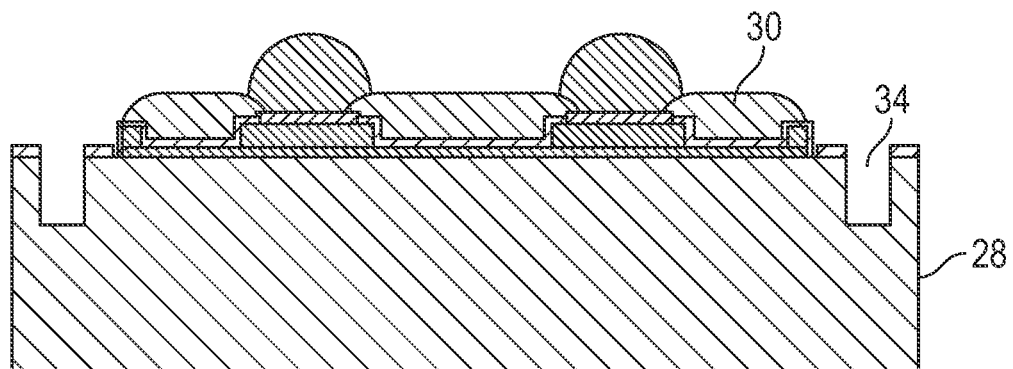

Referring to FIGS. 3A-3H, semiconductor packages at various points in a method of forming a semiconductor package having a guide for semiconductor device singulation is illustrated. Referring to FIG. 3A, the method includes providing a wafer 28 having a plurality of devices 30. In various implementations, the wafer may include, by non-limiting example, silicon, glass, gallium arsenide, silicon carbide, ruby, sapphire, silicon-on-insulator, and any other semiconductor substrate type. The semiconductor devices may include flip chip devices or wafer level packaged devices. As illustrated, the plurality of devices 30 include a plurality of bumps 32 on a first side of the plurality of devices 30. The bumps may be formed of various materials including, by non-limiting example, tin, silver, copper, gold, and any combination thereof. As previously discussed, while a single device is illustrated in the figures, as the method of packaging is a wafer scale method, more than one device may be included on the wafer during processing. Referring to FIG. 3B, the method includes etching one or more trenches 34 on a first side of the wafer 28 between each of the plurality of devices 30. In various implementations of the method, the etching may be performed through dry etching, half (partial) dicing, or other suitable methods for forming trenches in the material of the wafer. In some implementations, the trenches may have a width between about 50 microns to about 100 microns and a depth between about 50 microns to about 200 microns.

Figure 3C:
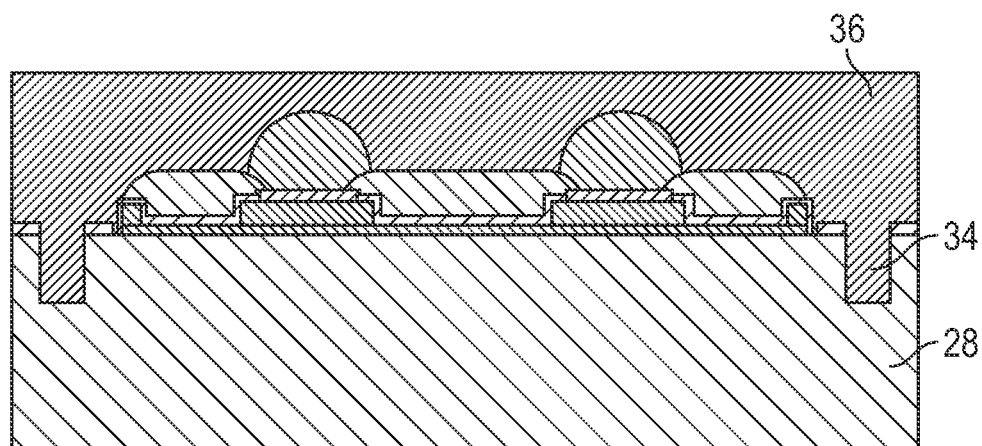
Figure 3D:
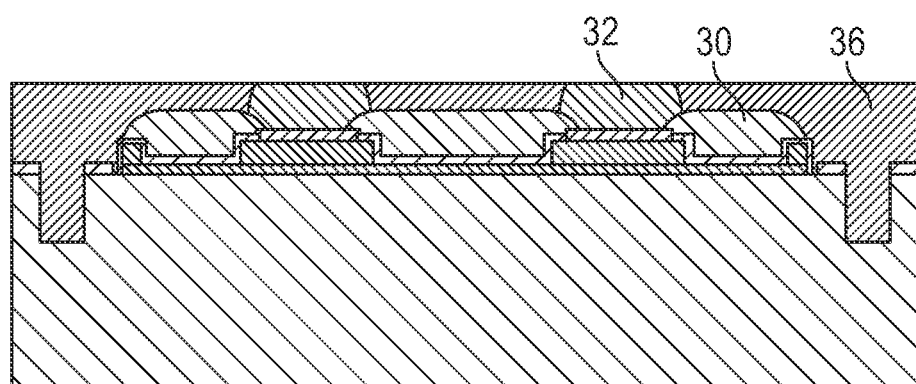

Referring to FIG. 3C, the method includes applying a molding compound 36 to the first side of the wafer 28. As illustrated, the molding compound 36 fills the one or more trenches. In various implementations, the molding compound 36 may be applied through, by non-limiting example, compression molding, printing, spin coating or any other method disclosed in this document. In some implementations, the molding compound may include epoxies, resins, fillers, colorants, polymers, and any other mold compound type or component. Referring now to FIG. 3D, in various implementations, the method includes grinding a first side of the molding compound 36 to a desired thickness. Grinding the molding compound exposes one or more bumps 32 on the first side of the plurality of devices. As previously discussed, the grinding process may remove some of the material of the bumps or may not remove any or much of the material depending on the bump type.

Referring to FIG. 3E, the method includes grinding a second side 29 of the wafer 28 to a desired thickness. The thickness of the wafer 28 may be between about 20 microns to about 200 microns. As previously described, grinding the second side 29 of the wafer 28 exposes the molding compound 36 included in the one or more trenches 34 as the material of the wafer is removed. It also has the effect of singulating the semiconductor devices from the material of the wafer itself, as they are held together through the molding compound only at this point. A top view 38 of the second side of the wafer 28 is illustrated in FIG. 3E next to the cross sectional view. From this view 38, the trenches are visible. Referring to FIG. 3F, the method includes etching a second side 29 of the wafer 28 to expose a height 40 of the molding compound 36 to form one or more steps 42 extending from the wafer 28. In some implementations, etching may include dry etching and any other method for etching the material of a semiconductor substrate disclosed herein that has at least some etch selectivity relative to the material of the molding compound. In various implementations, the one or more steps 42 may have a height of 3 microns to 10 microns and a width of 50 microns to 100 microns above the second side 29 of the wafer after the etching process is completed. In other implementations, the steps may be a stepped region composed of multiple steps, or a rounded region with a top height above the level of the second side 29 of the wafer.

Figure 3G:
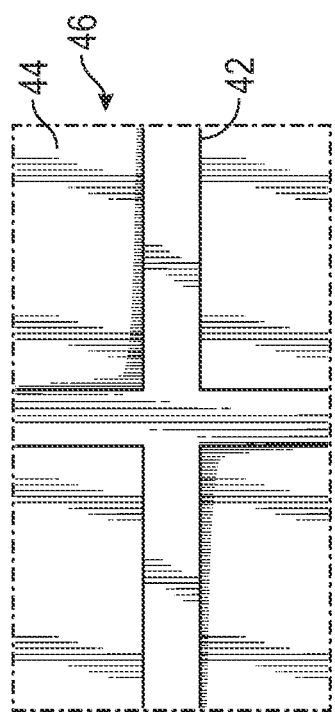
Figure 3G:
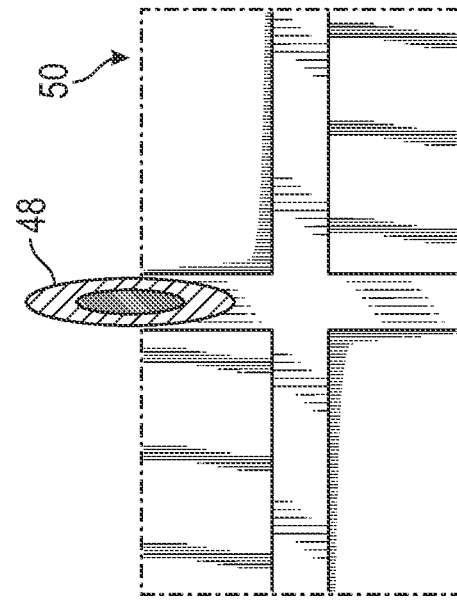
Figure 3G:
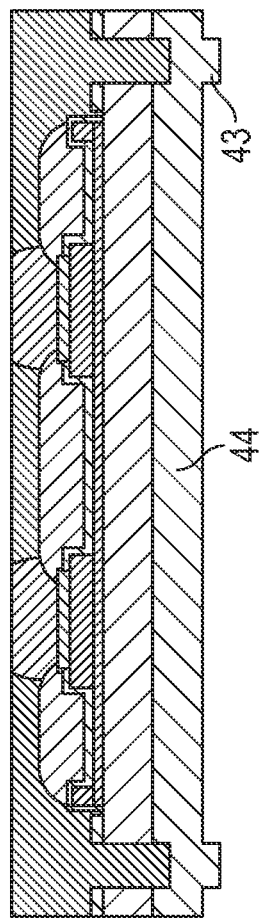

Referring to FIG. 3G, the method includes applying a back metallization 44 to a second side of the wafer. The back metallization is applied so that the one or more steps/stepped region 43 extend from the base of the back metallization. In various implementations, the back metallization may be for applied through sputtering, plating, or other suitable methods for applying back metal to a semiconductor wafer that results in a substantially conformal coating of the back side of the die. By non-limiting example, the metal applied to the second side of the wafer may include titanium, copper, nickel, gold, tin, silver, alloys thereof, any combination thereof, or any other metal or metal alloy. A bottom view 46 of the wafer having a back metallization 44 is shown, which indicates that the height of the one or more steps is now visible from the second surface of the wafer, permitting the location of the streets between the various semiconductor die to be indicated. Because of this, a pattern of scribe lines/streets between the various die now exists on the second side (back side) of the wafer, which can be used by singulating equipment to optically align the wafer prior to the singulation operations.

Figure 3H:
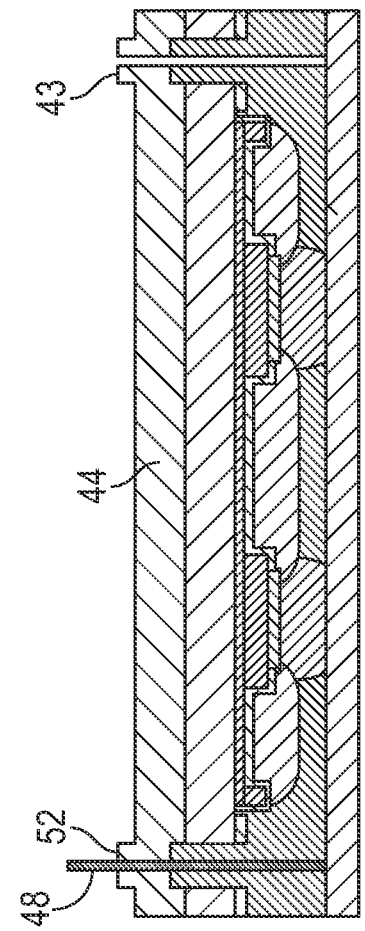

Referring to FIG. 3H, the method includes singulating the wafer at the one or more steps to form a plurality of semiconductor packages. In various implementations, singulation may be performed using a saw 48 as illustrated on the bottom view 50 of the wafer. Singulating the plurality of semiconductor packages may include a two-step process where the method includes a wider kerf width first cut and a second narrower kerf width cut. In other implementations, however, a single cut singulation process may be used. In other implementations, other singulation methods may be employed, including, by non-limiting example, water jet cutting, laser scribing, or various combinations of sawing, lasering, and/or water jet cutting could be utilized. In some implementations, the plurality of semiconductor packages may have a ridge 52 of remaining back metal around the perimeter of the package after singulation from the wafer. In other implementations, the plurality of semiconductor packages may have the material of the ridge removed/smoothed so that the packages retain a smooth surface on the second side of the back metallization. Given that the height of the ridge material is not large compared with the typical dimensions of packaging materials (die attach compounds, die flags, etc.) the presence of the ridge 52 may not impact the processing of the package during subsequent operations.

In places where the description above refers to particular implementations of a method of forming semiconductor packages and implementing components, sub-components, methods and sub-methods, it should be readily apparent that a number of modifications may be made without departing from the spirit thereof and that these implementations, implementing components, sub-components, methods and sub-methods may be applied to other methods of forming semiconductor packages.

What is claimed is:

1. A wafer comprising:
a first side and a second side, the second side opposite the first side;
a plurality of devices; and
a plurality of trenches formed through the wafer;
wherein a metal layer is coupled to the second side of the wafer, the metal layer comprising a plurality of ridges; and
wherein a molding compound is coupled over the wafer and into a plurality of trenches formed within the metal layer.

2. The wafer of claim 1, wherein the molding compound extends across an interface between the second side of the wafer and the metal layer.

3. The wafer of claim 1, wherein a depth of each trench of the plurality of trenches formed within the metal layer is 3 to 10 microns.

4. The wafer of claim 1, wherein a height of each ridge of the plurality of ridges is substantially the same as a depth of each trench of the plurality of trenches formed within the metal layer.

5. The wafer of claim 1, wherein the plurality of ridges is aligned with the plurality of trenches formed through the wafer.

6. The wafer of claim 1, wherein the metal layer comprises one of copper plating, nickel plating, gold plating, tin/silver plating, or any combination thereof.

7. A method of forming a wafer comprising:
providing a wafer comprising a plurality of devices;
forming one or more trenches in a first side of the wafer;
applying a molding compound to the first side of the wafer, wherein the molding compound fills the one or more trenches;
forming one or more steps between the molding compound and the wafer through thinning the second side of the wafer; and
applying a back metallization over the one or more steps between the molding compound and the wafer.

8. The method of claim 7, further comprising grinding the first side of the wafer to expose one or more bumps comprised in the plurality of devices.

9. The method of claim 7, wherein thinning the second side of the wafer comprises dry etching.

10. The method of claim 7, wherein a width of the one or more trenches each comprise a width of 50 to 100 microns.

11. The method of claim 7, wherein the one or more steps comprise a height of 3 to 10 microns.

12. The method of claim 7, wherein the back metallization comprises sputtered Ti/Cu.

13. The method of claim 7, wherein the back metallization comprises one of copper plating, nickel plating, gold plating, tin/silver plating, or any combination thereof.

14. A semiconductor package comprising:
- a substrate having a first side and a second side, the second side opposite the first side;
- a device coupled over the first side of the substrate;
- a metal layer coupled to and covering an entirety of the second side of the substrate, the metal layer comprising a ridge formed along an outer perimeter of the semiconductor package; and
- a molding compound coupled over the device and coupled into a notch within the metal layer.

15. The semiconductor package of claim 14, wherein the molding compound covers an interface between the second side of the substrate and the metal layer.

16. The semiconductor package of claim 14, wherein the ridge comprises a continuous ridge.

17. The semiconductor package of claim 14, wherein a height of the ridge is substantially the same as a height of the notch.

18. The semiconductor package of claim 14, wherein the molding compound covers a plurality of sidewalls of the substrate.

19. The semiconductor package of claim 14, wherein the ridge is aligned with the notch.

20. The semiconductor package of claim 14, wherein the metal layer comprises one of copper plating, nickel plating, gold plating, tin/silver plating, or any combination thereof.

\* \* \* \* \*